(12) United States Patent
Arun et al.

(10) Patent No.: US 9,960,019 B2
(45) Date of Patent: May 1, 2018

(54) LIFE ENHANCEMENT OF RING ASSEMBLY IN SEMICONDUCTOR MANUFACTURING CHAMBERS

(71) Applicant: Applied Materials, Inc., Santa Clara, CA (US)

(72) Inventors: Sandhya Arun, Brookefields (IN); Prashanth Kodigepalli, Bangalore (IN); Padma Gopalakrishnan, Fremont, CA (US); Ashish Bhatnagar, Fremont, CA (US); Dan Martin, Cupertino, CA (US); Christopher Heath John Hossack, Gilbert, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 14/270,993

(22) Filed: May 6, 2014

(65) Prior Publication Data
US 2014/0238604 A1    Aug. 28, 2014

Related U.S. Application Data

(63) Continuation of application No. 13/013,772, filed on Jan. 25, 2011, now Pat. No. 8,740,206.

(Continued)

(51) Int. Cl.
*H01J 37/32*     (2006.01)
*H01L 21/67*     (2006.01)
(Continued)

(52) U.S. Cl.
CPC .. *H01J 37/32798* (2013.01); *H01J 37/32495* (2013.01); *H01J 37/32623* (2013.01);
(Continued)

(58) Field of Classification Search
CPC .......... H01J 37/32798; H01J 37/32642; H01J 37/32623; H01J 37/32633; H01L 21/68735; H01L 21/67069
See application file for complete search history.

(56) References Cited

U.S. PATENT DOCUMENTS 5,476,548 A    12/1995  Lei et al.
5,632,873 A *  5/1997  Stevens ............. H01L 21/68721
                                                            118/503
(Continued)

OTHER PUBLICATIONS

International Search Report and Written Opinion dated Sep. 27, 2011 for Application No. PCT/US2011/022458.

(Continued)

*Primary Examiner* — Christopher M Koehler
*Assistant Examiner* — Seahee Yoon
(74) *Attorney, Agent, or Firm* — Patterson + Sheridan, LLP

(57) ABSTRACT

The present invention generally relates to a ring assembly that may be used in an etching or other plasma processing chamber. The ring assembly generally includes an inner ring body having a top planar surface and a bottom planar surface, and an outer ring body having a top surface, a bottom surface substantially parallel to the top surface, and an inside surface that extends between the top surface and the bottom surface, the inside surface having a roof covering a portion of the inner ring body when the inner ring body is disposed adjacent the roof, wherein the inner ring body can be flipped into a different position so that a portion of the inner ring body that is not covered by the roof provides a substantially planar surface.

19 Claims, 4 Drawing Sheets

Related U.S. Application Data

(60) Provisional application No. 61/298,854, filed on Jan. 27, 2010.

(51) Int. Cl.
*H01L 21/683* (2006.01)
*H01L 21/687* (2006.01)
*C23C 14/34* (2006.01)
*C23C 14/50* (2006.01)

(52) U.S. Cl.
CPC .. *H01J 37/32642* (2013.01); *H01L 21/67069* (2013.01); *H01L 21/68735* (2013.01); *C23C 14/34* (2013.01); *C23C 14/50* (2013.01); *H01L 21/6831* (2013.01)

(56) References Cited

U.S. PATENT DOCUMENTS

| | | | | |
|---|---|---|---|---|
| 5,740,009 A | * | 4/1998 | Pu | H01L 21/6831 |
| | | | | 361/234 |
| 5,748,434 A | * | 5/1998 | Rossman | H01L 21/6831 |
| | | | | 361/234 |
| 5,803,977 A | * | 9/1998 | Tepman | C23C 14/50 |
| | | | | 118/715 |
| 5,955,381 A | | 9/1999 | Bitting et al. | |
| 6,051,122 A | * | 4/2000 | Flanigan | C23C 16/4585 |
| | | | | 118/720 |
| 6,117,349 A | * | 9/2000 | Huang | H01J 37/32431 |
| | | | | 156/345.3 |
| 6,123,804 A | | 9/2000 | Babassi et al. | |
| 6,689,249 B2 | | 2/2004 | Ke et al. | |
| 7,041,200 B2 | * | 5/2006 | Le | C23C 14/34 |
| | | | | 204/192.12 |
| 7,981,262 B2 | * | 7/2011 | Pavloff | H01J 37/32477 |
| | | | | 118/720 |
| 8,056,503 B2 | * | 11/2011 | Kikuchi | H01J 37/32174 |
| | | | | 118/723 E |
| 8,790,499 B2 | * | 7/2014 | Young | C23C 14/3407 |
| | | | | 204/298.11 |
| 2003/0106646 A1 | * | 6/2003 | Ma | C23C 16/4585 |
| | | | | 156/345.51 |
| 2004/0000375 A1 | | 1/2004 | Liu et al. | |
| 2004/0074605 A1 | * | 4/2004 | Nezu | H01J 37/32623 |
| | | | | 156/345.47 |
| 2005/0155718 A1 | * | 7/2005 | Huang | H01J 37/32633 |
| | | | | 216/34 |
| 2006/0011138 A1 | * | 1/2006 | Kang | H01J 37/32623 |
| | | | | 118/723 R |
| 2006/0016561 A1 | * | 1/2006 | Choi | H01J 37/32623 |
| | | | | 156/345.51 |
| 2007/0125646 A1 | * | 6/2007 | Young | C23C 14/3407 |
| | | | | 204/298.12 |
| 2007/0209931 A1 | | 9/2007 | Miller | |
| 2008/0178801 A1 | | 7/2008 | Pavloff et al. | |
| 2008/0194113 A1 | | 8/2008 | Kim et al. | |
| 2008/0289766 A1 | * | 11/2008 | Heemstra | H01J 37/32623 |
| | | | | 156/345.51 |
| 2009/0221150 A1 | | 9/2009 | Hammond, IV et al. | |
| 2011/0159200 A1 | * | 6/2011 | Kogure | C23C 14/042 |
| | | | | 427/458 |

OTHER PUBLICATIONS

Office Action for Korean Application No. 20-2012-7000045 dated Feb. 23, 2015.

\* cited by examiner

LIFE ENHANCEMENT OF RING ASSEMBLY IN SEMICONDUCTOR MANUFACTURING CHAMBERS

CROSS-REFERENCE TO RELATED APPLICATIONS

This application is a continuation of U.S. application Ser. No. 13/013,772, filed Jan. 25, 2011, which claims benefit of U.S. Provisional Patent Application Ser. No. 61/298,854, filed Jan. 27, 2010, which are incorporated by reference herein.

BACKGROUND OF THE INVENTION

Field of the Invention

Embodiments of the present invention generally relate to a ring and ring assembly for an etching or other plasma processing chamber.

Description of the Related Art

In semiconductor processing chambers, substrates undergo various processes such as deposition, etching and annealing. During some of the processes, the substrate is placed onto a substrate support such as an electrostatic chuck (ESC), for processing. In an etch process a ring may be placed around the substrate to prevent erosion of the areas of the substrate support that are not covered by the substrate. The ring focuses the plasma and positions the substrate in place.

Rings are usually made of quartz material and are highly consumed in the etch process as they are exposed to etching gases and/or fluids. The rings are etched during wafer processing and need to be replaced after a set of substrates (wafers) are processed. The rings that are significantly eroded are usually replaced during wet clean. Wet cleaning is a process for removing etching residues using a cleaning chemical, and some of the cleaning chemicals may remain in the chamber after chamber cleaning. Therefore, the rings may be exposed to and eroded by the cleaning chemical. Thus, significantly reducing the service life of the ring. In some situations, a ring may need to be replaced after every wet clean, which leads to wastage of expensive quartz material.

Thus, there is a need in the art for a ring with an improved service life.

SUMMARY OF THE INVENTION

The present invention generally relates to a ring assembly that may be used in an etching or other plasma processing chamber. A ring assembly as described herein is designed to increase the useful life of the ring as compared to conventional rings. The ring assembly has at least two distinct pieces, also referred to as bodies. An inner ring body will correspond to a location where the majority of erosion occurs during use. The inner ring body of the ring assembly can be flipped and used again until both sides have eroded beyond their useful life. Collectively, the two bodies generally have the shape of a single piece ring, but service life of the ring assembly has a longer service life than a conventional single piece ring.

In one embodiment, a ring assembly is provided. The ring assembly generally includes an inner ring body having a top planar surface and a bottom planar surface, and an outer ring body having a top surface, a bottom surface substantially parallel to the top surface, and an inside surface that extends between the top surface and the bottom surface, the inside surface having a roof covering a portion of the inner ring body when the inner ring body is disposed adjacent the roof, wherein the inner ring body can be flipped into a different position so that a portion of the inner ring body that is not covered by the roof provides a substantially planar surface.

In another embodiment, a ring assembly is provided. The ring assembly generally includes an outer ring body, comprising a top surface and a bottom surface substantially parallel to the top surface, an outside surface extending between the top and bottom surfaces, an inside surface extending between the top and bottom surfaces, the inside surface having a notch, and the notch having a roof projecting from an upper portion of the outer ring body, a first and second annular extensions extending from the bottom surface of the outer ring body, wherein the first and second annular extensions are parallel and radially spaced from each other, and a third annular extension extending from the outer ring body in a direction perpendicular to the first and second annular extensions, the third annular extension forming part of the inside surface and having a surface slanted relative to the top surface and the bottom surface of the outer ring body at an angle above zero, and an inner ring body disposed radially inward of the outer ring body, the inner ring body comprising a top surface abutting and projecting inward of the third annular extension, and an outside diameter surface disposed below the third annular extension and abutting the outer ring body.

In yet another embodiment, a ring assembly is provided. The ring assembly generally includes an outer ring body having a top surface, a bottom surface opposite the top surface, an outside surface extending between the top and bottom surfaces, and an extension extending from the outer ring body in a direction away from the outside surface, wherein the extension has a surface slanted relative to the top surface at an angle above zero, and an inner ring body being surrounded by the outer ring body, wherein the inner ring body is symmetrically nestable against the outer ring body in two orientations, the nested inner ring body and outer ring body having the same combined sectional profile when the inner ring body is in either flipped orientation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to a ring assembly that may be used in an etching or other plasma processing chamber. The ring assembly may be made at least in two distinct pieces, for example, an inner ring body and an outer ring body which nest together. The inner ring body has a geometry that allows the ring assembly to maintain a single sectional profile when the inner ring body and outer ring body are nested together, no matter which side of the inner ring body is facing the outer ring body. The inner ring body is reusable in that if one surface becomes eroded, the inner ring body may be flipped over and used again with the outer ring body until the outer ring body and/or both sides of the inner ring body have eroded beyond their useful life. Collectively, the two bodies generally have the shape of a single conventional piece ring, but the service life of the ring assembly is longer than a conventional single piece ring.

Figure 1A:
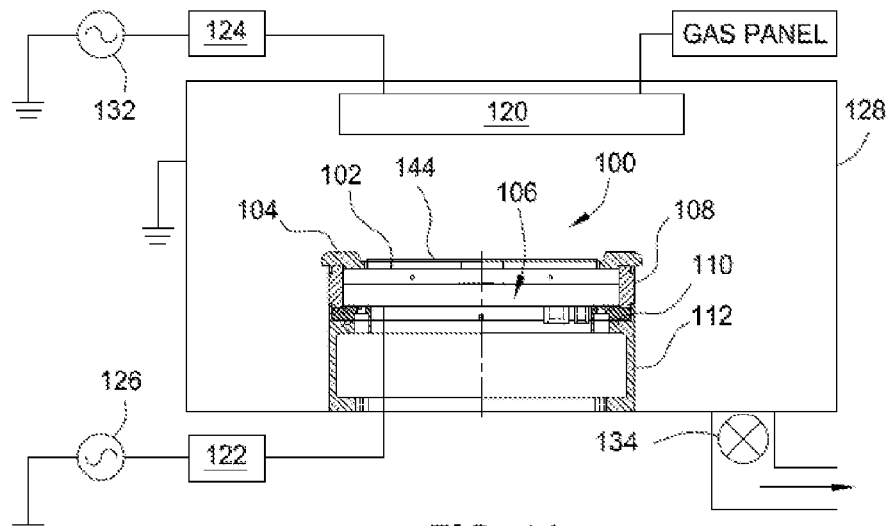
FIG. 1A is a schematic, cross sectional view of an exemplary substrate support with a conventional single piece ring disposed in a process chamber.

FIG. 1A is a schematic, cross sectional view of an exemplary substrate support 100 with a conventional single piece ring 104 disposed in a process chamber 128. While not discussed here in detail, the substrate support 100 is typically disposed in a plasma processing chamber, such as an etching chamber. The process chamber 128 may be utilized alone or, as a processing module of an integrated semiconductor substrate processing system, or cluster tool. The substrate support 100 is disposed below a showerhead 120, which is used to supply various gases into the process chamber 128. The substrate support 100 may be biased by a DC power supply (now shown). An RF power source 126 may optionally be coupled to the substrate support 100 through a matching network 122. The showerhead 120 may be coupled to an RF power source 132 through a matching network 124. The interior of the process chamber 128 is a high vacuum vessel that is coupled through a throttle valve (not shown) to a vacuum pump 134. In operation, the substrate is placed on the substrate support 100 and the chamber interior is pumped down to a near vacuum environment. One or more gases are introduced from the gas panel via the showerhead 120 into the process chamber 128, and ignited into a plasma in the process chamber 128 by applying the power from the RF power source 132 to the showerhead 120 disposed on the substrate support 100 and/or applying RF power from the RF source 126 to the substrate support 100 while applying the power from the bias source to bias the substrate support 100. The formed plasma may be used to etch a feature in a substrate during processing and then pumped out of the process chamber 128 through the vacuum pump 134. It is understood that other components of the process chamber 128 have been omitted for the sake of brevity.

The substrate support 100 generally includes an electrostatic chuck (ESC) 102, a conventional single piece ring 104, a cathode 106 to electrically bias the ESC 102, an insulator pipe 108, a pedestal insulator 110, and a pedestal support 112. The insulator pipe 108 and the pedestal insulator 110 function to electrically isolate the chamber walls and the substrate support 100, respectively, from the electrical bias applied to the ESC 102. In the embodiment shown in FIG. 1A, the conventional single piece ring 104 is a single piece ring that rests on the ESC 102 and the insulator pipe 108. A substrate 144, when placed onto the substrate support 100, will rest on the ESC 102 and be surrounded by the conventional single piece ring 104.

Figure 1B:
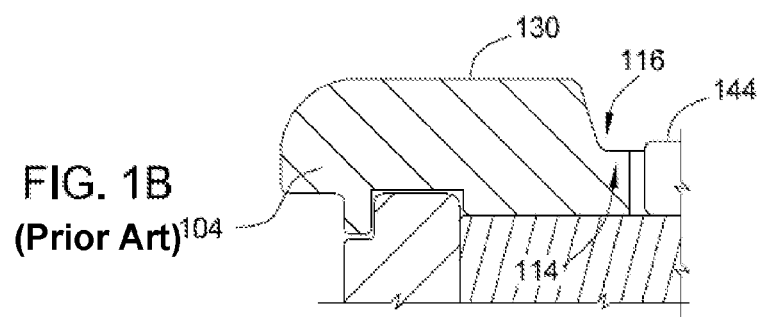
FIG. 1B is a schematic, cross sectional view of the ring of FIG. 1A.
Figure 1C:
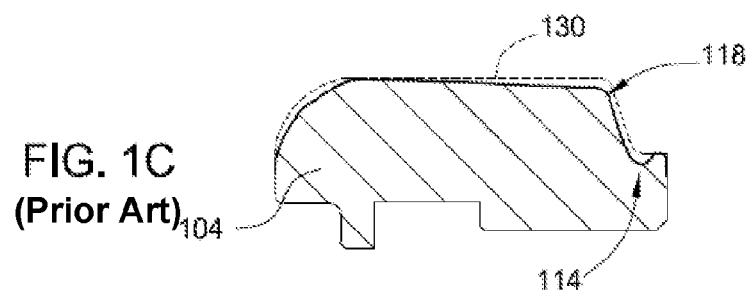
FIG. 1C is a schematic illustration showing erosion profile of the ring of FIG. 1A.

FIG. 1B is a schematic, cross sectional view of the conventional single piece ring 104 of FIG. 1A. The conventional single piece ring 104 has an upper surface 130 which is exposed to the plasma during processing. The conventional single piece ring also includes a seating area 114 that has a top surface 116 that is substantially level with a substrate 144 placed on the ESC 102. The existing "single piece" ring design is typically subjected to maximum erosion near a wafer seating area 114 due to exposure to a plasma etching process. FIG. 1C shows an approximate erosion profile 118 of the top surface of the conventional single piece ring 104 near an end of the ring service life, with the original upper surface 130 shown in phantom for comparison. As shown in FIG. 1C, the seating area 114 has eroded significantly more than the remaining areas of the conventional single piece ring 104 and has eroded non-uniformly. As the seating area 114 no longer has its original substantially planar shape, substrate positioning and processing may be adversely impacted. The entire ring 104 is typically replaced at this time, which results in wastage of quartz material.

In plasma etch chambers, the conventional single piece ring 104 protects the ESC from exposure to plasma during processing. Since the ring 104 also focuses the plasma, the ring 104 is usually made of quartz and is highly consumable during processing. In order to extend the life of the rings, a ring assembly of the present invention is designed for the least cost of manufacture and allow multiple usage to thereby reduce the cost of tool ownership (CoO) to customers.

Figure 2A:
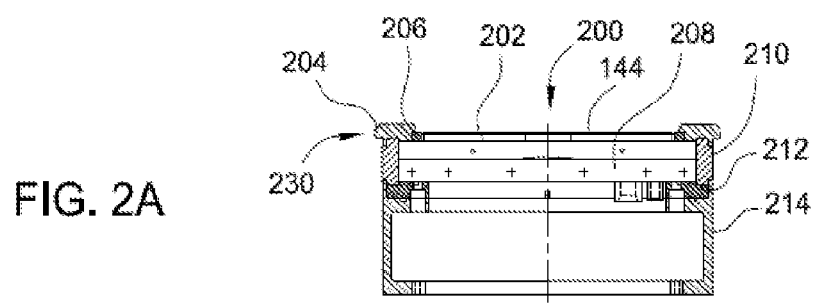
FIG. 2A is a schematic, cross sectional view of an exemplary substrate support having a ring assembly according to one embodiment of the invention.

FIG. 2A illustrates a schematic, cross sectional view of an exemplary substrate support 200 having a ring assembly according to one embodiment of the present invention. While not discussed here in detail, the substrate support 200 is typically disposed in a plasma processing chamber, such as an etching chamber as illustrated in FIG. 1A, which has been omitted for the sake of brevity. The substrate support 200 generally includes an ESC 202, a ring assembly 230, a cathode 208, an insulator pipe 210, a pedestal insulator 212 and a pedestal support 214.

Figure 2B:
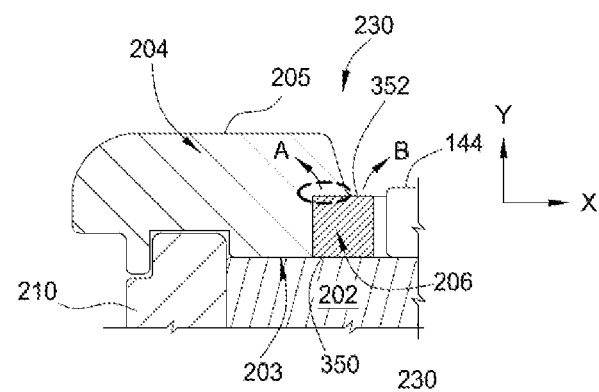
FIG. 2B is a schematic, cross sectional view of the ring assembly of FIG. 2A.
Figure 3A:
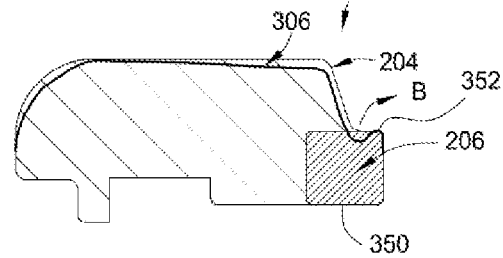
FIG. 3A is a schematic illustration showing erosion profile of the ring assembly according to one embodiment.
Figure 3B:
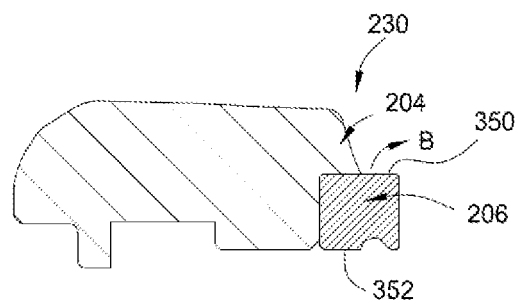
FIG. 3B is a schematic, cross sectional view of the ring assembly after the inner ring has been flipped according to one embodiment.

FIG. 2B is a schematic, cross sectional view of the ring assembly 230 of FIG. 2A. The ring assembly 230 of the present invention generally consists of two ring bodies, i.e., an inner ring body 206 and an outer ring body 204, which are positioned on the electrostatic chuck 202 during processing. Similar to the conventional single piece ring 104 discussed with reference to FIGS. 1A-C above, most of the erosion takes place on the inner ring body 206 near the substrate seating area B, causing the top surface of the inner ring body 206 to no longer be planar (see erosion profile 306 and eroded seating surface 352 in FIG. 3A). However, once the eroded inner ring body 206 is flipped as shown in FIG. 3B, the substrate seating area B is once again substantially planar. Thus, rather than replacing an entire single ring, the inner ring body 206 may be flipped over and reused with the outer ring body 204. Flipping of the inner ring body 206 doubles the service life of the entire ring assembly 230 relative to the conventional single piece ring 104.

In one embodiment, the inner ring body 206 is designed such that a portion of the surface (area A as shown in FIG. 2B) is covered by the outer ring body 204 and hence prevents exposure to plasma. As a result, the area A remains substantially planar even as the area B erodes from plasma exposure. Since area A remains planar, this surface (i.e., area A) provides a planar bottom surface to the inner ring body 206 after being flipped over, as shown in FIG. 3B. After a wet clean cycle, the inner ring body 206 can be flipped over along an axis X (FIG. 2B) that is in parallel to the top surface 205 of the outer ring body 204 such that a bottom surface 350 of the inner ring body 206 that was in contact with an upper surface 203 of the electrostatic chuck 202 can be freshly provided as a seating area for a substrate while the planar, uneroded bottom surface 350 now facing upwards and defining areas A and B. Thus, the inner ring body 206 may be used a second time with the original bottom surface 350 now facing upwards until the outer ring body 204 and/or inner ring body 206 have eroded beyond their useful life.

While the ring shape body is shown and described in instant specification, it is understood that this concept of "flip over and reuse" should not be limited to annular ring shape. Any object with desired shape or profile is contemplated as long as the object can be disposed radially inward of the outer ring and flipped into a different position to provide a substantially planar seating area for the substrate. The outer ring body 204 and inner ring body 206 can be made with different non-conducting materials to reduce the erosion rate. The outer ring body 204 can also be coated or made with materials such as ceramics, PEEK, polyamides, polyimides, epoxy, etc., which are resistant to corrosive environment and other non conducting materials. Ring assemblies may also be used in dielectric, metal and polysilicon etch and other applications. In conductor etching, the inner ring can be coated with non-conducting material such as ceramic to increase its service life.

The two-piece design of the ring assembly 230 enables the outer ring body 204 to be least sacrificed during the process. The two-piece design of the ring assembly 230 also enables multiple reuse of the outer ring body 204 and thereby saves the quartz material and reduces the CoO. This concept of protecting inner ring under outer ring, flip over and reuse can also be applied to redesign existing other rings or single rings to increase service life. This concept may also be extended to chambers processing substrate or wafer sizes of any size.

The ring assembly disclosed herein can be used in dielectric etch chambers such as the MxP+, eMxP+, Super-E, EMAX and EMAX CT+ chambers available from Applied Materials, Inc., Santa Clara, Calif. Additionally, the ring assembly disclosed herein may also be used in metal/conductor etch chambers such as the DPS II available from Applied Materials, Inc. It is to be understood that the ring assembly discussed herein may be used in chambers sold by other manufacturers as well.

Figure 4:
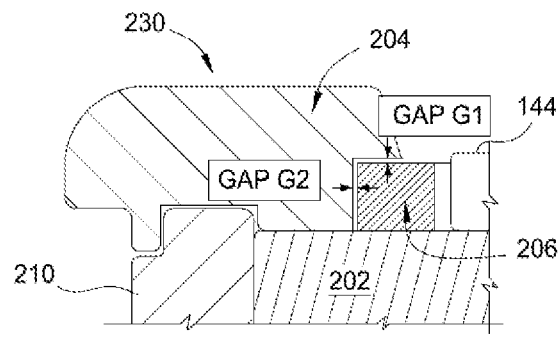
FIG. 4 is a schematic, cross sectional view showing spacing between inner and outer rings of the ring assembly according to one embodiment.

FIG. 4 is a schematic, cross sectional view showing the ring assembly 230 illustrating spacing between the inner ring body 206 and outer ring body 204 according to one embodiment. The spacing (Gap G1 and Gap G2) is the respective vertical and horizontal separation between the inner ring body 206 and the outer ring body 204. In regards to Table I, the example shown is to ensure avoidance of plasma penetration and is specific to one ring used in dielectric etch chambers. The actual numbers may vary for other etch rings or the type of the etch applications.

TABLE I

|  | Maximum (inches) | Minimum (inches) |
|---|---|---|
| Gap 1 - G1 | 0.008 | 0.002 |
| Gap 2 - G2 | 0.0275 | 0.0025 |

Figure 5A:
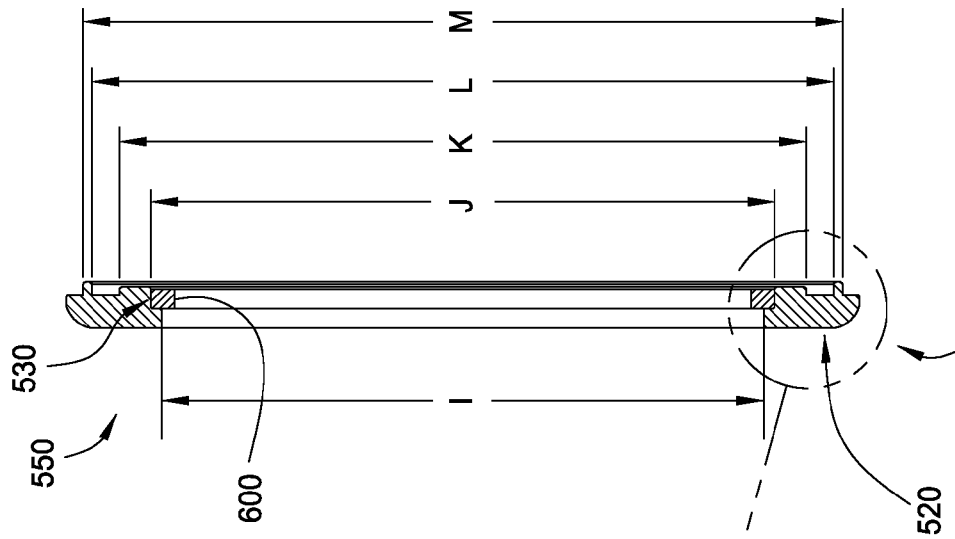
FIG. 5A is a schematic cross sectional view of an outer ring of a ring assembly according to one embodiment.
Figure 5B:
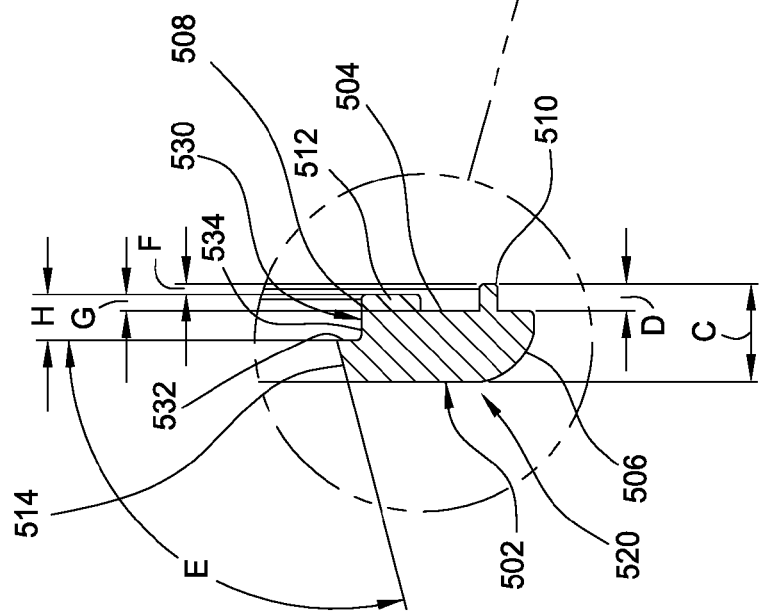
FIG. 5B is an enlarged view of a portion of the outer ring illustrated in FIG. 5A.

FIG. 5A is a schematic cross sectional view of an outer ring body 500 of a ring assembly 550 according to one embodiment. FIG. 5B is an enlarged view of a portion of the outer ring body 500 illustrated in FIG. 5A. In one embodiment, the outer ring body 500 may comprise quartz. In another embodiment, the outer ring body 500 may comprise clear, fused quartz. The outer ring body 500 may also be fabricated from or coated with other materials.

As shown in FIGS. 5A and 5B, the outer ring body 500 includes a main body 520 having a generally planar top surface 502 and a generally planar bottom surface 504 that is substantially parallel to the top surface. While not shown here, it is understood that a substrate is generally surrounded by the outer ring body 500, and an upper surface of the substrate is facing a direction away from the bottom surface 504 of the outer ring body 500. The outer ring body 500 also includes an outside surface 506 that extends between the top surface 502 and the bottom surface 504. The outer ring body 500 also includes an inside surface 508 that extends between the top surface 502 and the bottom surface 504. The top surface 502, bottom surface 504, outside surface 506 and inside surface 508 collectively comprise the outer ring main body 520. The outer ring main body 520 has a height of between about 0.5 inches and about 0.75 inches as shown by arrows "C". The inside surface 508 also includes a notch 530 which nests with an inner ring body 600, described below with reference to FIGS. 6A-B. The notch 530 is configured to project from the upper portion of the main body 520 and form a substantially horizontal overhang or roof 532 which covers a portion of the area "Q" of the inner ring body 600 when nested. In other words, the outside diameter surface 606 (FIG. 6B) of the inner ring body 600 is disposed against an inner wall 534 of the outer ring body 500. The inner ring body 600 has a geometry that allows the ring assembly 550 to maintain a single sectional profile when the inner ring body 600 and outer ring body 500 are nested, no matter which of the lower or upper surfaces 602, 604 of the inner ring body 600 is mated with the notch 530 of outer ring body 500, as shown in FIG. 3B. In one embodiment, the inside surface 508 is substantially vertical and perpendicular to the roof 532.

In one embodiment, a first annular extension 510 is extended from the bottom surface 504 of the outer ring main body 520. The first annular extension 510 extends in a direction away from the top surface 502 and is disposed at a location spaced from the edge of the outside surface 506. In one example, the first annular extension 510 extends from the bottom surface 504 for a distance of between about 0.15 inches to about 0.20 inches as shown by arrows "D". The outside diameter of the first annular extension 510 is between about 9.75 inches and about 10.1 inches as shown by arrows "M". The inside diameter of the first annular extension 510 is between about 9.73 inches and about 9.93 inches as shown by arrows "L".

A second annular extension 512 may also extend from the bottom surface 504 in a direction away from the top surface 502. The second annular extension 512 may abut the inside surface 508. In one embodiment, the second annular extension 512 extends from the bottom surface 504 for a distance of between about 0.097 inches to about 0.103 inches as shown by arrows "G". In one embodiment, the outside diameter of the second annular extension 512 is between about 9.000 inches and about 9.100 inches as shown by arrows "K". In another embodiment, the inside diameter of the second annular extension 512 is between about 8.300 inches and about 8.500 inches as shown by arrows "J". The first annular extension 510 may extend from the bottom surface 504 by a greater distance than the second annular extension 512 of between about 0.070 inches and about 0.075 inches as shown by arrows "F".

A third annular extension 514 may extend from the main body 520 in a direction away from the outside surface 506. An end of the third annular extension 514 forming part of the inside surface 508 may be angled relative to the roof 532 at an angle of between about 100 degrees and about 120 degrees, as shown by arrows "E". The roof 532 forming the bottom of the third annular extension 514 may be at a height of between about 0.25 inches and about 0.30 inches above the bottom of the second annular extension 512, as shown by arrows "H". The diameter of the third annular extension 514 as measured at the bottom of the third annular extension 514 is between about 7.980 inches and about 8.000 inches, as shown by arrows "I". It is contemplated that the numbers listed here may vary depending upon the size of the substrate or chamber.

Figure 6A:
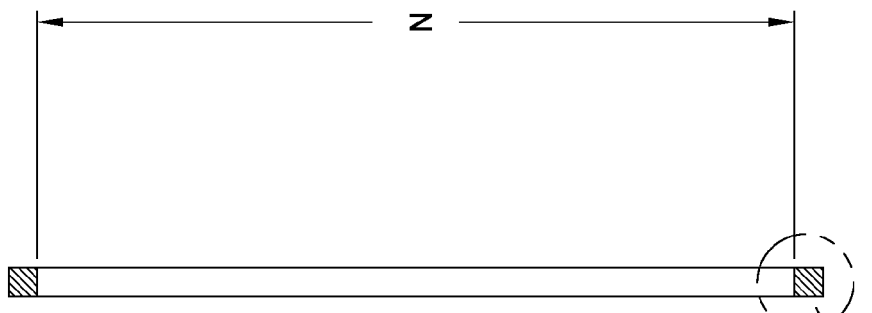
FIG. 6A is a schematic cross sectional view of the inner ring of a ring assembly according to one embodiment.
Figure 6B:
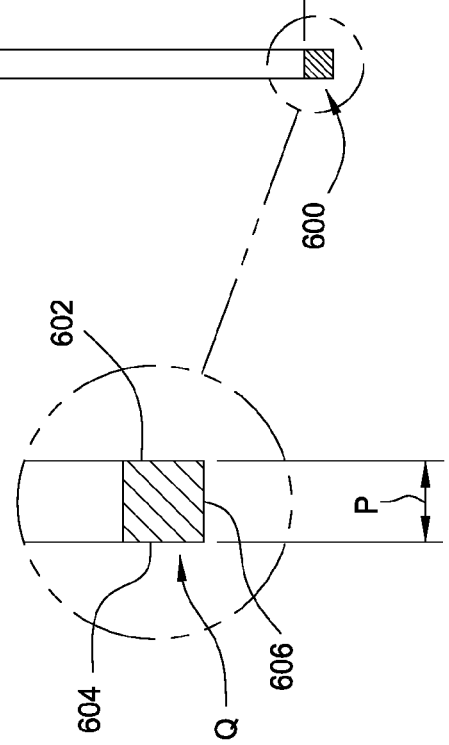
FIG. 6B is an enlarged view of a portion of FIG. 6A.

FIG. 6A is a schematic cross sectional view of the inner ring body 600 of the ring assembly 550 according to one embodiment. The inner ring body 600 and outer ring body 500 as illustrated in FIGS. 6A and 5A constitute a ring assembly as discussed and shown previously in FIGS. 2A-4. FIG. 6B is an enlarged view of a portion of FIG. 6A. In one embodiment, the inner ring body 600 may comprise quartz or other material. In another embodiment, the inner ring body 600 may comprise clear, fused quartz. The inner ring body 600 may have an inner diameter of between about 7.730 inches and about 7.740 inches as shown by arrows "N". The inner ring body 600 may have a height of between about 0.275 inches and about 0.300 inches as shown by arrows "P". The inner ring body 600 may have a square or rectangular cross-section. Lower and upper surfaces 602, 604 of the inner ring body 600 are parallel and perpendicular to the center axis of the inner ring body 600. An outside diameter surface 606 of the inner ring body 600 may be perpendicular to the surfaces 602, 604 or have another shape which conforms to the inside surface 508 of the notch 530 below the roof 532 of the outer ring body 500 which is configured to nest with the inner ring body 600 when either surfaces 602, 604 are disposed adjacent the roof 532 of the outer ring body 500.

By utilizing a ring assembly that comprises two ring bodies (i.e., inner and outer rings) rather than a single piece, the service life of the ring assembly is improved relative to a conventional single piece ring. Particularly, the concept of flip over and reuse of the inner ring reduces the wastage of material. The outer ring that is used continuously for multiple wet cleans until its service life is over further reduce the cost of consumables to customers. The usage of non-conducting materials also improves the service life of the ring assembly.

While the foregoing is directed to embodiments of the present invention, other and further embodiments of the invention may be devised without departing from the basic scope thereof, and the scope thereof is determined by the claims that follow.

What is claimed is:

1. A ring assembly, comprising:
   an inner ring body having a top planar surface and a bottom planar surface; and
   an outer ring body comprising:
   a top surface;
   a bottom surface substantially parallel to the top surface;
   an outside surface extending between the top and bottom surfaces;
   an inside surface that extends between the top surface and the bottom surface, wherein the inside surface has a roof and a portion of the inner ring body is symmetrically nestable under the roof against the outer ring body in two orientations, wherein the top planar surface of the inner ring body is spaced apart from the roof to define a vertical gap therebetween when the inner ring body is nested within the outer ring body and when the inner ring body and the outer ring body are supported on a common surface, wherein an inner diameter of the inner ring body is greater than an outer diameter of a substrate to be processed and an inner diameter of the outer ring body is greater than the inner diameter of the inner ring body but less than an outer diameter of the inner ring body;
   a first annular extension extending from the bottom surface in a direction away from the top surface and from a location spaced from the outside surface;
   a second annular extension extending from the bottom surface in a direction away from the top surface, the second annular extension abutting the inside surface; and
   a third annular extension extending from the outer ring body in a direction away from the outside surface, the third annular extension forming part of the inside surface.

2. The ring assembly of claim 1, wherein the third annular extension has a surface slanted at an angle relative to the top surface of the outer ring body.

3. The ring assembly of claim 2, wherein the angle is between about 100 degrees and about 120 degrees.

4. The ring assembly of claim 2, wherein the outside surface has a generally curved surface.

5. The ring assembly of claim 1, wherein the inner ring body can be flipped over along an axis that is parallel to the top surface of the outer ring body so that a top surface of a profile of the ring assembly does not change regardless of the bottom planar surface or top planar surface of the inner ring body being disposed against the outer ring body.

6. The ring assembly of claim 1, wherein an outer surface extending between the top planar surface and the bottom planar surface of the inner ring body is spaced apart from the inside surface of the outer ring body to define a horizontal gap therebetween when the inner ring body is nested against the outer ring body and when the inner ring body and the outer ring body are supported on a common surface.

7. The ring assembly of claim 6, wherein the vertical gap is between about 0.002 inches to about 0.008 inches and the horizontal gap is between about 0.0025 inches to about 0.0275 inches.

8. A ring assembly, comprising:
an outer ring body, comprising:
- a top surface and a bottom surface substantially parallel to the top surface;
- an outside surface extending between the top and bottom surfaces;
- an inside surface extending between the top and bottom surfaces, the inside surface having a notch, and the notch having a roof projecting from an upper portion of the outer ring body;
- a first and second annular extensions extending from the bottom surface of the outer ring body, wherein the first and second annular extensions are parallel and radially spaced from each other; and
- a third annular extension extending from the outer ring body in a direction perpendicular to the first and second annular extensions, the third annular extension forming part of the inside surface and having a surface slanted relative to the top surface and the bottom surface of the outer ring body at an angle above zero; and an inner ring body partially disposed radially inward of the outer ring body, wherein the inner ring body is symmetrically nestable in the notch in two flipped orientations, the inner ring body comprising:
- a top surface abutting and projecting inward of the third annular extension; and
- an outer surface disposed below the third annular extension and abutting the outer ring body,
wherein the top surface of the inner ring body is spaced apart from the roof to define a vertical gap therebetween when the inner ring body is nested within the outer ring body and when the inner ring body and the outer ring body are supported on a common surface, wherein an inner diameter of the inner ring body is greater than an outer diameter of a substrate to be processed and an inner diameter of the outer ring body is greater than the inner diameter of the inner ring body but less than an outer diameter of the inner ring body.

9. The ring assembly of claim 8, wherein the nested inner ring body and outer ring body have the same combined sectional profile when the inner ring body is in either flipped orientation.

10. The ring assembly of claim 9, wherein the third annular extension partially covers the top surface of the inner ring body.

11. The ring assembly of claim 8, wherein the angle is between about 100 degrees and about 120 degrees.

12. The ring assembly of claim 11, wherein the first annular extension and the second annular extension extend different distances from the bottom surface of the outer ring body.

13. The ring assembly of claim 8, wherein the inner ring body comprises quartz or clear fused quartz.

14. The ring assembly of claim 8, wherein the outer surface of the inner ring body is spaced apart from the inside surface of the outer ring body to define a horizontal gap therebetween when the inner ring body is nested against the outer ring body and when the inner ring body and the outer ring body are supported on a common surface.

15. The ring assembly of claim 14, wherein the vertical gap is between about 0.002 inches to about 0.008 inches and the horizontal gap is between about 0.0025 inches to about 0.0275 inches.

16. A ring assembly, comprising:
an outer ring body having a top surface, a bottom surface opposite the top surface, an outside surface and an inside surface extending between the top and bottom surfaces, a first and second annular extensions parallel and radially spaced from each other extending from the bottom surface, and a third annular extension extending from the inside surface in a direction away from the outside surface perpendicular to the first and second annular extensions, wherein the third annular extension has a surface slanted relative to the top surface at an angle above zero; and an inner ring body being partially surrounded by the outer ring body, wherein the inner ring body is symmetrically nestable under the third annular extension in the outer ring body in two orientations, the nested inner ring body and outer ring body having the same combined sectional profile when the inner ring body is in either flipped orientation, wherein a top surface of the inner ring body is spaced apart from the third annular extension to define a vertical gap therebetween and an outer surface of the inner ring body abutting the third annular extension is spaced apart from the inside surface to define a horizontal gap therebetween when the inner ring body is nested within the outer ring body and when the inner ring body and the outer ring body are supported on a common surface, wherein an inner diameter of the inner ring body is greater than an outer diameter of a substrate to be processed and an inner diameter of the outer ring body is greater than the inner diameter of the inner ring body but less than an outer diameter of the inner ring body.

17. The ring assembly of claim 16, wherein the inner and outer ring bodies comprise quartz.

18. The ring assembly of claim 16, wherein the inner and outer ring bodies comprise non-conducting materials.

19. The ring assembly of claim 16, wherein the angle is between about 100 degrees and about 120 degrees.

* * * * *